United States Patent [19]
Lee

[11] Patent Number: 5,899,729
[45] Date of Patent: May 4, 1999

[54] METHOD AND APPARATUS FOR THE MANUFACTURE OF A SEMICONDUCTOR INTEGRATED CIRCUIT DEVICE HAVING DISCONTINUOUS INSULATING REGIONS

[75] Inventor: Seong Min Lee, Seoul, Rep. of Korea

[73] Assignee: Samsung Electronics Co., Ltd., Suwon, Rep. of Korea

[21] Appl. No.: 08/941,070

[22] Filed: Sep. 30, 1997

[30] Foreign Application Priority Data

Oct. 1, 1996 [KR] Rep. of Korea .................. 1996 43508

[51] Int. Cl.⁶ ................................................ H01L 21/46
[52] U.S. Cl. ......................... 438/460; 438/113; 438/114
[58] Field of Search ................................... 438/113, 114, 438/460, 461, 462, 463, 464, 465

[56] References Cited

U.S. PATENT DOCUMENTS

| | | | |
|---|---|---|---|
| 5,136,354 | 8/1992 | Morita et al. .......................... | 438/465 |
| 5,171,716 | 12/1992 | Cagan et al. ............................ | 438/113 |
| 5,256,564 | 10/1993 | Narita ..................................... | 438/462 |
| 5,393,706 | 2/1995 | Mignardi et al. . | |
| 5,414,297 | 5/1995 | Morita et al. ........................... | 438/465 |
| 5,430,325 | 7/1995 | Sawada et al. . | |
| 5,458,269 | 10/1995 | Loomis . | |
| 5,494,549 | 2/1996 | Oki et al. . | |
| 5,593,925 | 1/1997 | Yamaha ................................... | 438/465 |

Primary Examiner—Kevin M. Picardat
Attorney, Agent, or Firm—Jones & Volentine, L.L.P.

[57] ABSTRACT

A semiconductor wafer having an active surface separated into device regions with semiconductor chips formed thereon and scribe regions formed between the device regions. The wafer includes an insulating layer formed on the active surface in the device regions. The insulating layer has a first edge and a second edge oriented in a confronting relationship. The first edge and the second edge end at the scribe regions.

11 Claims, 7 Drawing Sheets

METHOD AND APPARATUS FOR THE MANUFACTURE OF A SEMICONDUCTOR INTEGRATED CIRCUIT DEVICE HAVING DISCONTINUOUS INSULATING REGIONS

BACKGROUND OF THE INVENTION

1. Field of the Invention

The present invention generally relates to a semiconductor integrated circuit (IC) device, and more particularly to a method and apparatus for the manufacture of a semiconductor IC device having discontinuous insulating layer regions for protecting the ICs from damage due to a dicing saw blade.

2. Description of the Related Arts

In general, many IC devices or chips are formed on a single semiconductor wafer during a batch processing method, which provides great economic benefit and increases productivity. Individual IC chips, called "die", are separated from the wafer during a wafer sawing or dicing step. Subsequent assembly processes are then performed on the individual chips.

FIG. 1 illustrates a conventional wafer sawing process step. A wafer 4, having a number of IC devices 6 formed thereon, is mounted to a wafer ring 2. An adhesive tape (not shown) is attached to the inactive back surface of the wafer 4. The adhesive tape supports the separated chips during subsequent process steps, e.g., a die attaching step. The wafer ring 2 is mounted to a wafer sawing machine and the wafer 4 is scribed along scribe lines or scribe regions 8 (dashed lines in FIG. 1) by a saw blade 10, and thereafter separated along such lines to divide the wafer into individual chips.

The wafer 4 is first scribed along the horizontal scribe lines, and then scribed along the vertical scribe lines. During scribing, the saw blade 10 has a revolution speed of about 30,000 to 60,000 rpm. The thickness of the saw blade 10 is about ten times greater than the thickness of the pattern layers on the IC devices. The wafer 4 can be scribed with a diamond-pointed scribing tool or cut by a laser or saw. During scribing, the wafer 4 is partially cut and therefore is not immediately separated into its individual pieces, rather it must be broken after scribing has occurred.

FIG. 2 is a partial sectional view of a semiconductor wafer depicting some of the problems that occur during the conventional wafer sawing step. The wafer 4 is scribed along the scribe line 8 by the saw blade 10 which is rotating at a high speed. In the mean time, it is common to form an insulating layer 12 between the neighboring IC devices 6. The insulating layer 12 may be a silicon dioxide ($SiO_2$) layer, or an interlayer dielectric for the IC devices having multiple metallization layers. On the insulating layer 12, so-called TEG (Test Element Group) devices may be formed. The TEG devices are used to test the electrical characteristics of IC devices under development and confirm the stability of the existing fabrication processes of the IC devices being developed. Of course, the TEG regions can be removed before the wafer sawing step, since the test results have already been stored.

When the saw blade 10 passes along scribe lines 8 to scribe the wafer 4, the stress due to the rotating saw blade 10 is directly transferred to the fixed wafer 4. The degree of stress on the wafer 4 depends on several factors including the thickness and the revolution speed of the saw blade, scribing depth, and crystal orientation of the wafer. The strongest stress will be observed along arrow lines a' declined by about 45 degrees to the wafer surface as shown in FIG. 2. Pattern layers forming the IC devices 6 are spaced at a sufficient distance from the strongest stress position, and therefore the impact of the rotating saw blade 10 on the pattern layers is somewhat weakened. However, the rotating saw blade 10 causes the insulating layer 12 formed on the scribe line 8 to peel off from the wafer surface. This peeling off of the insulating layer 12 does cause some defects to edge portions of the IC devices 6. These defects to the edge pattern layers may eventually cause failures in the IC devices during subsequent assembly processes.

U.S. Pat. No. 5,430,325, describes a semiconductor chip having dummy patterns of a linear shape on an insulating film, as shown in FIG. 3, in an attempt to prevent peeling of the insulating layer.

Referring to FIG. 3, the disclosed IC device 6 is a light emitting diode chip (LED). A recognition mark 18 is formed on an edge of the chip for recognizing the position of the separated IC chip when the die bonding or wire bonding steps are automatically performed. The recognition mark 18 is formed through impurity diffusion of the same type as the radiating area of the LED chip and is positioned within a recognition area 20.

If the wafer is sawed along the scribe line 14 by the above-described mechanical sawing method, the insulating layer 12 begins to is peel off. If the peeling from the dicing edge 15 reaches the recognition area 20, recognition errors may occur during the steps of die bonding or wire bonding. Therefore, dummy patterns 16 are formed between the recognition area 20 and the scribe line 14 in order to prevent the peeling of the insulating layer from advancing to the recognition area 20. The dummy patterns 16 are aluminum layers which are formed on the insulating layer 12 by vapor deposition of aluminum.

The conventional dummy patterns 16 apparently prevent some damage to a particular area of the chip, e.g., the recognition area 20 caused by the peeling of the insulating layer 12. However, areas of the chip that are not protected by the dummy patterns 16 are still subject to the full effects of the saw blade 10.

Although the conventional dummy patterns, comprising an aluminum metallization layer coated on the insulating layer, somewhat prevent the peeling of the insulating layer, they do have some drawbacks. First, in order to form the aluminum layer with a sufficient thickness to protect the pattern layer of the IC devices, it is necessary to perform the chemical vapor deposition (CVD) process for an extended period. Furthermore, the aluminum metallization layer can easily corrode during subsequent assembly processes, thereby causing IC device failures.

The size of the separated IC chips obviously influence the total dimensions of the packaged devices. If the scribing position of the saw blade is close to the IC device, the mounting density of the separated IC device increases by the reduced dimension of the separated IC device. Further, if the scribing area is reduced, the number of the separated IC devices from a single wafer increases, which results in productivity improvements. However, the closer the scribing position of the saw blade is to the IC device, the greater the impact of the saw blade on the IC patterns. Therefore, it is necessary to reduce the negative impact of the saw blade while maintaining close proximity of the scribe lines to the IC devices.

If the impact of the saw blade is reduced and the scribing position of the saw blade is closer to the IC device, especially for a package device employing TAB (Tape Automated Bonding) technology, many advantages can be realized. For example, during an inner lead bonding (ILB) process in which metal bumps formed on electrode pads and individual chips are bonded to leads of TAB tape, sagging or sinking of the leads can occur. The sagging lead may cause contact between the leads and edges of the chip thereby causing electrical problems.

SUMMARY OF THE INVENTION

Accordingly, the present invention provides a semiconductor IC device having discontinuous insulating regions and a manufacturing method of making same.

The foregoing can be achieved by a semiconductor IC device having device regions on which a plurality of semiconductor chips are formed and scribe regions for dividing the semiconductor chips in the device regions into a separated semiconductor chips. A portion of the insulating layer is absent in the scribe regions thereby forming discontinuous insulating regions between each of the device regions.

Specifically, the wafer comprises an insulating layer formed on the active surface in the device regions only. The insulating layer has a first edge and a second edge oriented in a confronting relationship, such that the first edge and the second edge terminate at the scribe regions.

In another aspect, the present invention provides a method for manufacturing a semiconductor IC device including the steps of preparing a semiconductor wafer having device regions where a plurality of semiconductor chips are formed on an active surface of a semiconductor wafer, and scribing regions for dividing the semiconductor chips on the wafer into separated chips. A portion of an insulating layer formed throughout an active surface of the wafer is selectively removed or is absent in the scribe regions to provide a discontinuous insulating layer on the wafer. The wafer is then sawed along the scribing region where the insulating layer has been removed or is absent.

BRIEF DESCRIPTION OF THE DRAWINGS

These and various other features and advantages of the present invention will be described with reference to the accompanying drawings, wherein like reference numerals designate like structural elements, and, in which.

DETAILED DESCRIPTION OF THE PREFERRED EMBODIMENTS

Preferred embodiments of the present invention will be described below with reference to the accompanying drawings.

Figure 1:
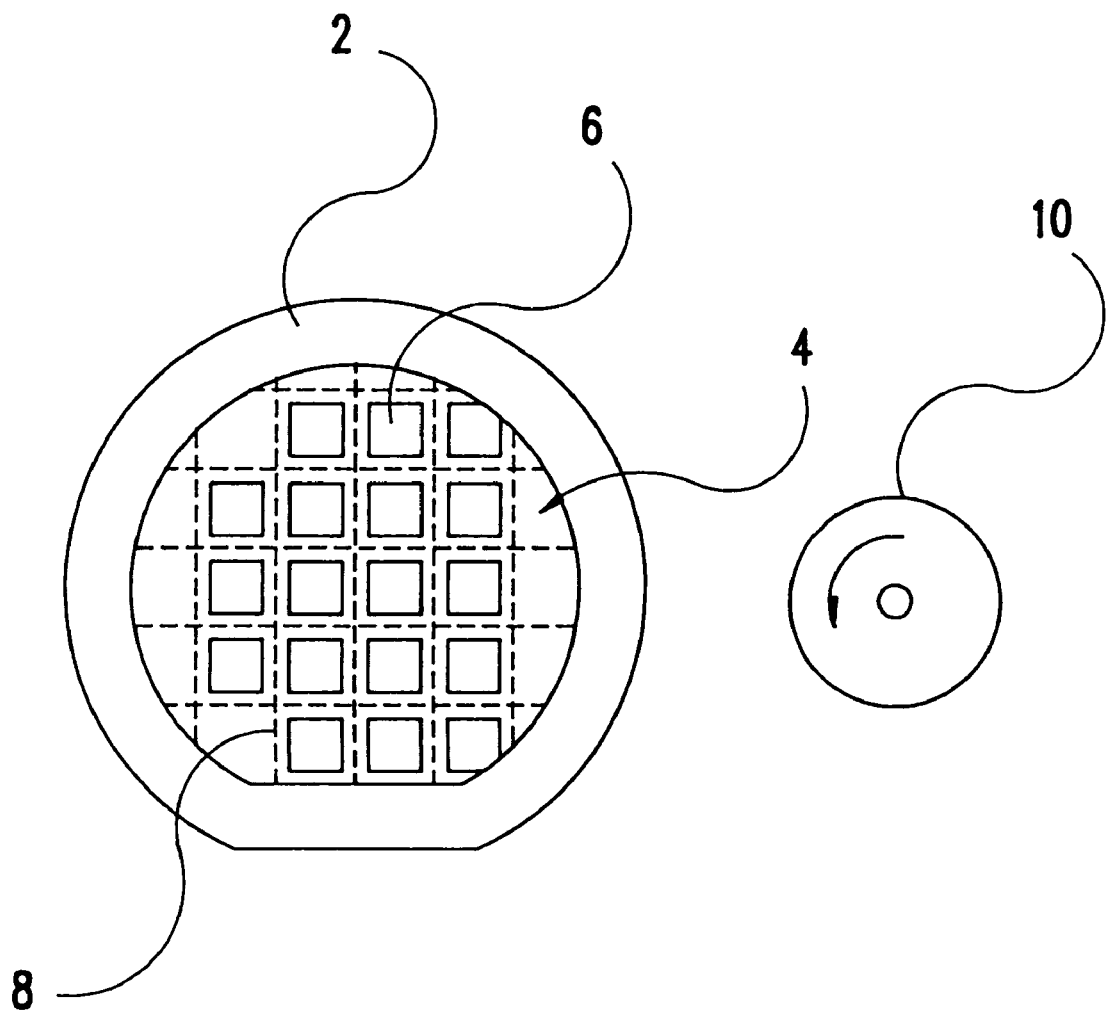
FIG. 1 is a schematic view showing a conventional wafer sawing process step.
Figure 2:
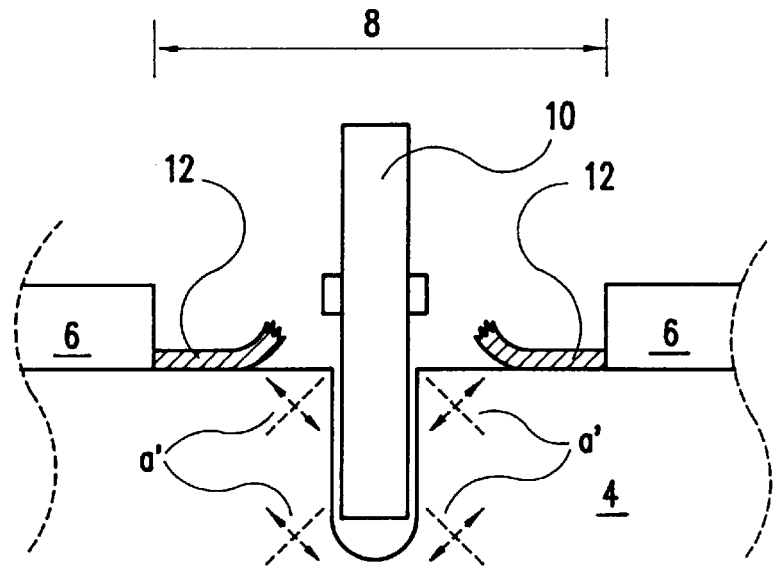
FIG. 2 is a partial sectional view of a semiconductor wafer showing problems occurring in the conventional wafer sawing step.
Figure 3:
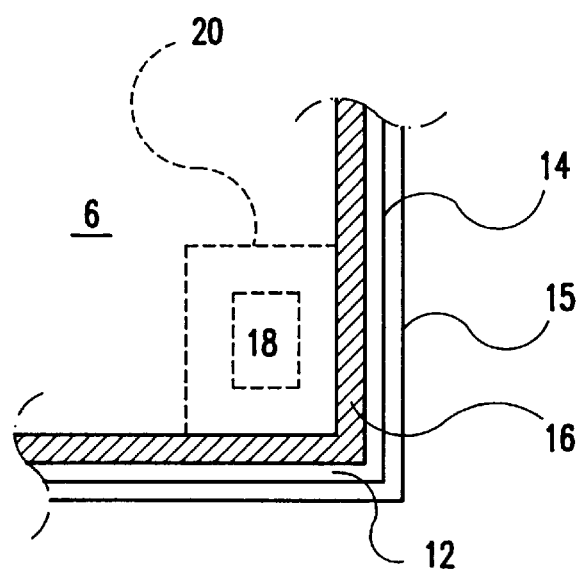
FIG. 3 is a partial plan view of a semiconductor chip having dummy patterns for preventing peeling of an insulating layer in the conventional wafer sawing step.
Figure 4A:
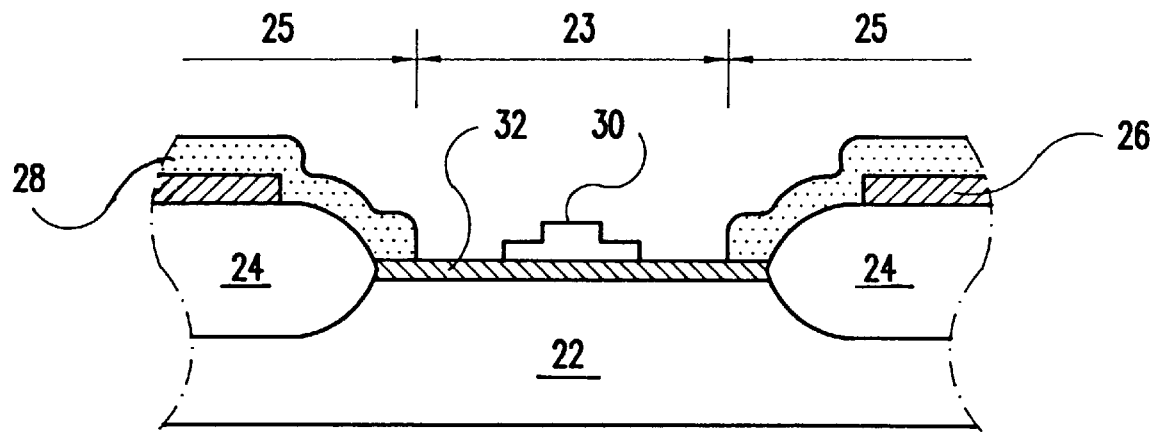
FIG. 4A is a partial sectional view depicting a process of forming discontinuous insulating regions according to a first embodiment of the present invention.
Figure 4B:
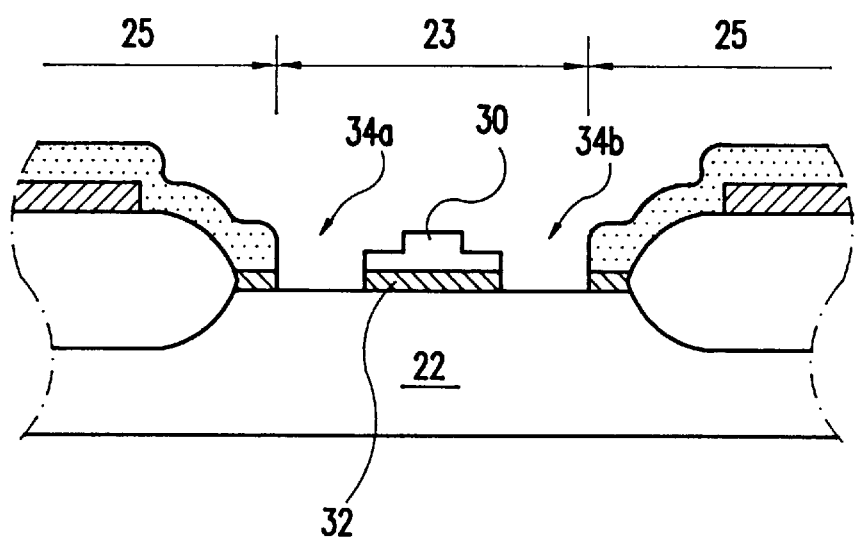
FIG. 4B is another partial sectional view depicting the process of forming discontinuous insulating regions according to the first embodiment of the present invention.

FIG. 4A and FIG. 4B are partial sectional views depicting a process of forming insulating regions having a structure that prevents the impact of the saw blade on an IC device according to a first embodiment of the present invention.

Generally, the scribing regions 23, along which the saw blade passes, are positioned between device regions 25. Various patterns can be formed on device regions 25, depending on the function and purpose of the IC device. For example, in FIGS. 4A and 4B, field oxidation layer 24, metallization layer 26, and insulating layer 28 are formed on wafer 22. The field oxidation layer 24 (e.g., a layer grown by thermal oxidation of silicon) is for electrically insulating transistors within the device regions 25. The metallization layer 26 provides electrical interconnection paths made of aluminum. The insulating layer 28 may be an interlayer dielectric for IC devices having multiple metallization layers, or a passivation layer which is coated on the entirety of the exposed surfaces except for the electrode pad of the IC devices.

In the scribing regions 23, Test Element Group (TEG) patterns 30 are formed on a portion of a second insulating layer 32. The second insulating layer may be formed at the same time as the silicon oxidation process for forming the field oxidation layer 24, or it may be formed during a separate process step. The TEG patterns 30 may comprise various pattern layers depending on which device is tested, and as such, a specific description thereof will not be provided here. In the wafer sawing step, a saw blade will pass along the regions on which the TEG patterns 30 are formed.

After the various pattern layers are formed on the semiconductor wafer 22 as shown in FIG. 4A, and prior to the wafer sawing step, discontinuous insulating regions 34a and 34b are formed by removing part of the second insulating layer 32 as shown in FIG. 4B.

Etching methods used in conventional photolithography processes may be employed to partially remove the second insulating layer 32. The discontinuous insulating regions 34a and 34b may be formed by directly etching portions of the insulating layer 32 when the insulating layer 32 is formed on the scribing regions 23 during the wafer manufacturing process.

Note that semiconductor IC devices are manufactured through hundreds of successive processes, and the time when the insulating layer 32 is formed on the scribing regions 23 will vary according to the function and structure of the IC device. Therefore, depending on the particular IC device, forming the discontinuous insulating regions 34a and 34b during the wafer manufacturing process may complicate the process. In some cases it maybe necessary to use an additional mask to selectively etch those regions corresponding to the discontinuous insulating regions 34a and 34b.

In other cases, it is preferable to form the discontinuous insulating regions 34a and 34b on the insulating layer 32, after the wafer manufacturing step. In this way, one mask can be used both for the passivation layer formed on the top surface of the pattern layer and for the discontinuous insulating layer. Accordingly, patterns for selectively removing the insulating layer can be included in a mask having patterns for exposing electrode pads from the passivation layer.

The wafer 22 on which the discontinuous insulating layers 34a and 34b are formed is then scribed with the saw blade such as a diamond-pointed scribing tool. Because the insulating layer 32 of the scribing regions 30 does not extend to the device regions 25, the pattern layer of the device regions 25 is not affected by the peeling of the insulating layer 32 due to the impact of the saw blade.

Figure 5A:
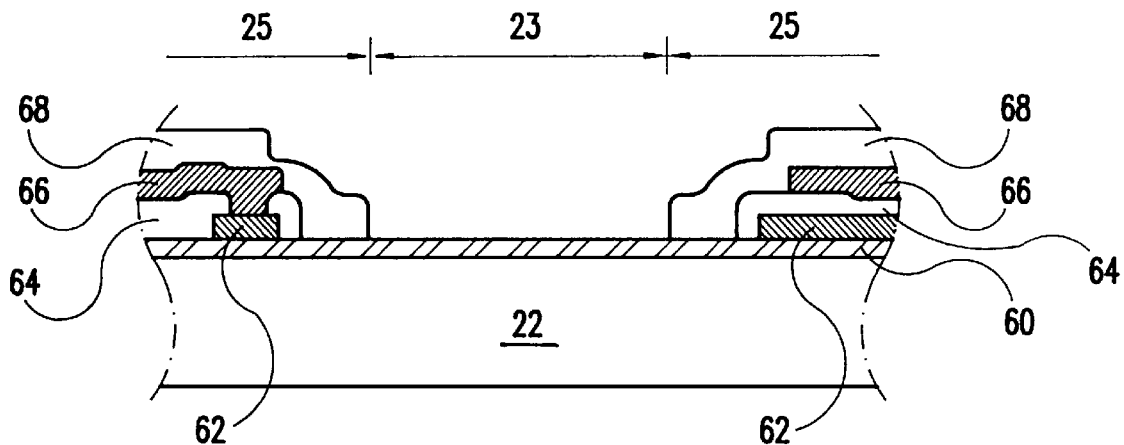
FIG. 5A is a partial sectional view depicting a process of forming discontinuous insulating regions according to a second embodiment of the present invention.
Figure 5B:
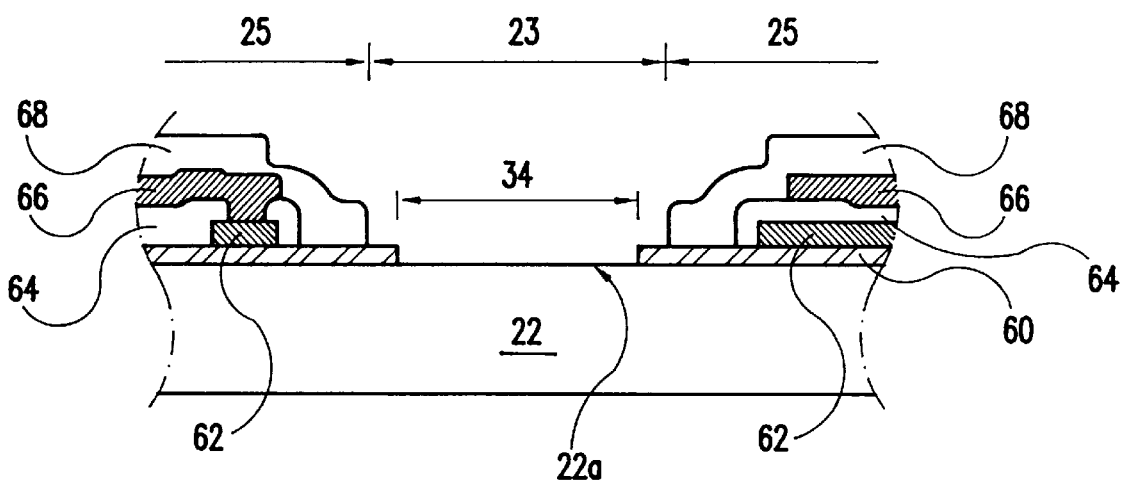
FIG. 5B is another partial sectional view depicting the process of forming discontinuous insulating regions according to the second embodiment of the present invention.

FIGs. 5A and 5B are partial sectional views depicting a process of forming discontinuous insulating regions for preventing the impact of the saw blade on an IC device according to a second embodiment of the present invention. The discontinuous insulating region 34 may be formed according to the same criteria as described above in conjunction with FIGS. 4A and 4B. Note that the present inventive apparatus and method may be used with a wide variety of IC devices. In this example, the pattern layers formed in the device regions 25 comprise a first interlayer dielectric 60, a first metallization layer 62, a second interlayer dielectric 64, a second metallization layer 66, and passivation layer 68.

Unlike FIGS. 4A and 4B, the TEG patterns are not formed along the scribing regions 23 in FIGs. 5A and 5B. In this second embodiment, the first interlayer dielectric 60 in the scribing regions 23 is removed to expose the upper surface 22a of the silicon wafer 22 to create the discontinuous insulating region 34 as shown in FIG. 5B. Consequently, even though the wafer in the scribing region 23 is scribed by the saw blade, the device regions 25 are not affected by the peeling of the insulating layer 60 since the scribing regions 23 lack the insulating layer 60 that normally transmits the impact of the saw blade to the device regions 25.

Figure 6:
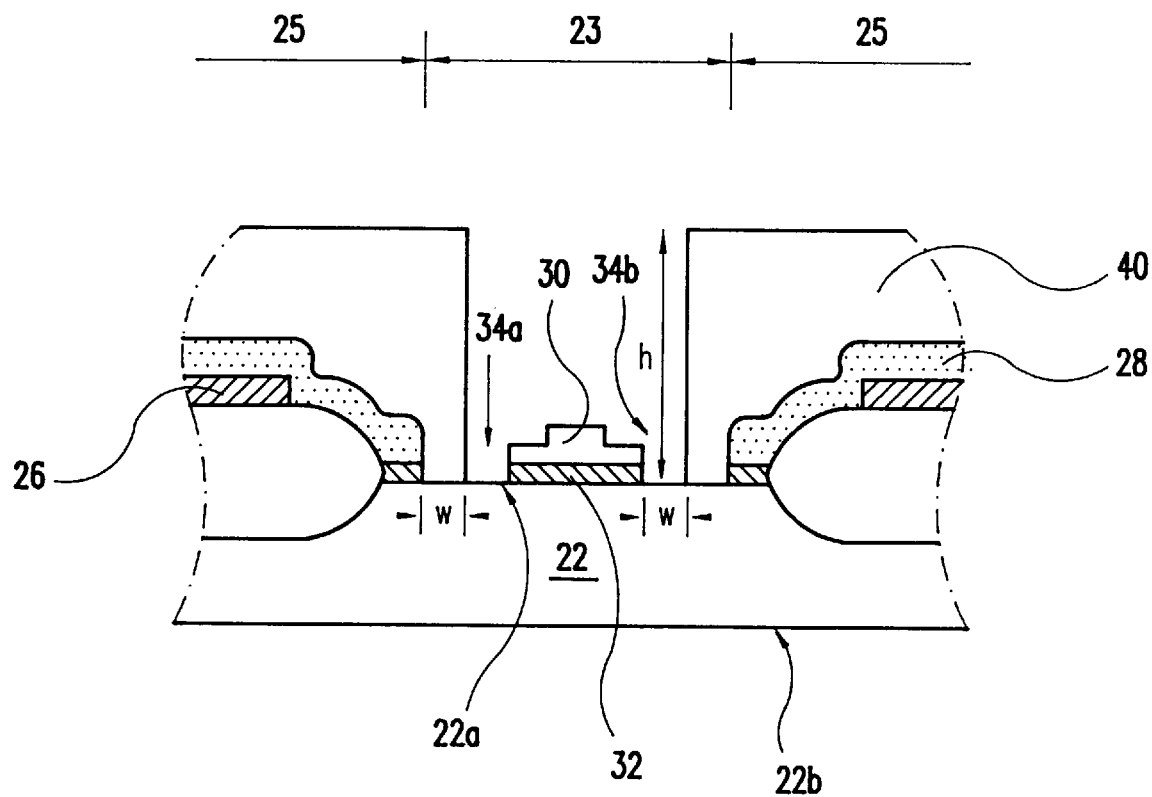
FIG. 6 is a partial sectional view of IC device having a structure according to a third embodiment of the present invention.

FIG. 6 is a partial sectional view of an IC device having the structure according to a third embodiment of the present invention. As generally described in FIGS. 4A and 4B, the discontinuous insulating layer 32 is formed on the scribing regions 23. Subsequently a polyimide layer 40 is formed on the surface of the wafer. The polyimide layer 40 is formed so that electrode pads (not shown) of the separated IC chips and a part of the scribing regions 23 are exposed to the outside. In general, the polyimide layer 40 is coated on the surface of the wafer on which a passivation layer 28 is formed before the assembly process. The polyimide layer 40 prevents damage to the active surface 22a of the wafer 22 during a back lapping process, which grinds the inactive back surface 22b of the wafer 22 to reduce the thickness of the wafer 22 prior to assembly. Further, the polyimide layer 40 protects the passivation layer 28 during the molding process, which forms the package body, and for reducing soft error ratio (SER) caused by a-particle radiation.

Herein, it is preferable to form the polyimide layer 40 with a greater thickness than the conventional polyimide layer in order to prevent damage to the pattern layers of the IC devices by the impact of the saw blade. For example, the polyimide layer 40 could have a height 'h' of 10 $\mu$m or more (see FIG. 6) in the case of 16 M DRAM (Dynamic Random Access Memory). Considering that the height of the pattern layers formed on the device regions 25, including the passivation layer 28, is about 1 $\mu$m or less, the height 'h' of the polyimide layer 40 is quite large.

It is preferable that the polyimide layer 40 be formed such that it extends into a portion of the discontinuous insulating regions 34a and 34b and directly contacts the surface 22a of the silicon wafer 22. For example, in the above-described 16 M DRAM, the width between the scribing regions is 120~140 $\mu$m and the width of the regions cut by the saw blade is 60 $\mu$m. The width 'w' of the regions (see FIG. 6) on which the polyimide layer 40 directly contacts the wafer surface 22a is 10~15 $\mu$m for each of scribing regions 34a and 34b.

The polyimide layer has a considerably larger bonding force with the silicon wafer surface, compared with the silicon oxidation layer. For example, consider a silicon oxidation layer having a height of 2 $\mu$m formed on the surface of the silicon wafer, having a length of 30 $\mu$m and a height of 300 $\mu$m. A molding compound having a height of 10 $\mu$m is then formed on the silicon oxidation layer. The bonding force of the silicon oxidation layer alone to the surface of the silicon wafer increases to 0.93 MPa. On the other hand, when the same silicon oxidation layer is formed on the surface of the same silicon wafer and the polyimide layer having a height of 10 $\mu$m is deposited thereon, the bonding force of the silicon oxidation layer to the surface of the to silicon wafer is increased to 2.39 MPa. However, if the polyimide layer having a height of 10 $\mu$m is directly coated on the same silicon wafer without the silicon oxidation layer, the bonding force of the polyimide layer to the surface of the silicon improves to 23.23 MPa, which is at least ten times greater than the other cases.

Because the polyimide layer is formed by a spin coating method, it is possible to easily coat a thick layer in a short time. Further, the polyimide layer is an effective protective layer since it has a greater capacity to absorb the force of the impact by the saw blade than other pattern layers, and it has excellent thermal conductivity and resistibility to chemical reactions.

When the present invention as described above is applied to the package device employing the TAB technology, it provides many additional advantages.

Figure 7:
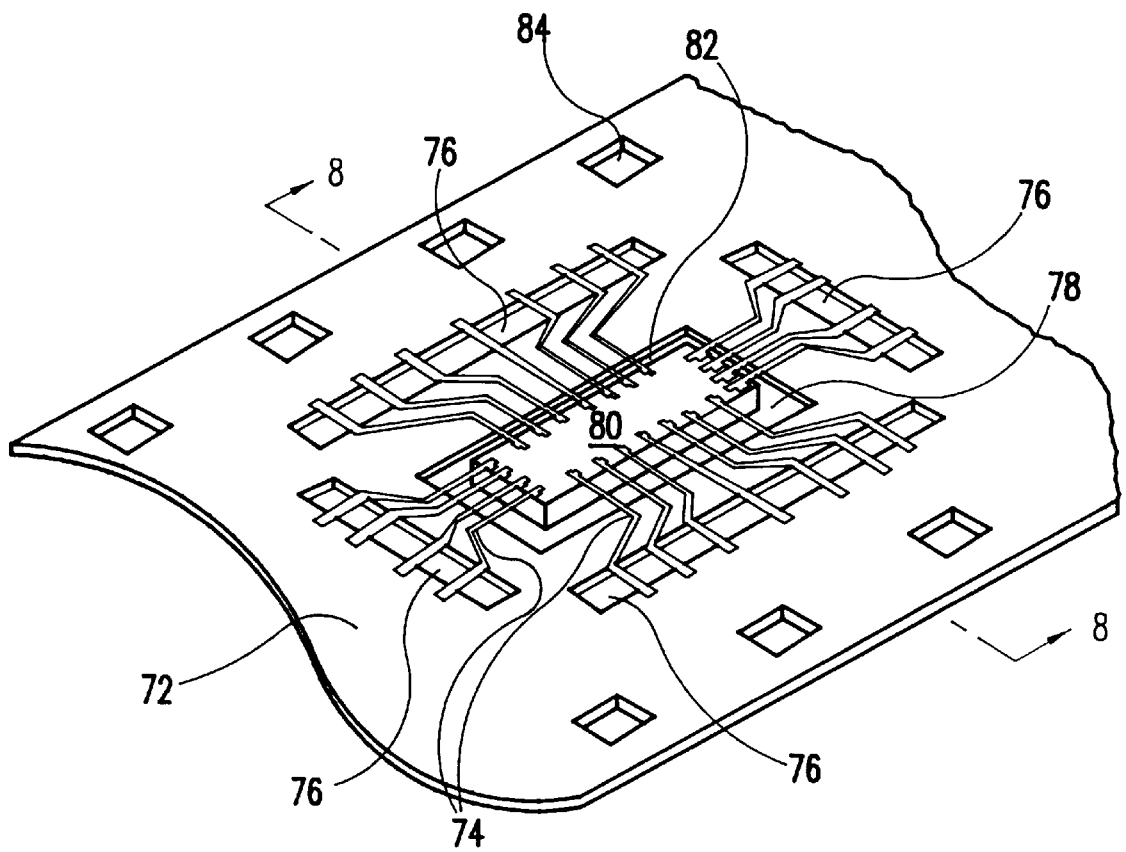
FIG. 7 is a perspective view depicting inner lead bonding (ILB) between leads of a TAB tape and a semiconductor chip.
Figure 8:
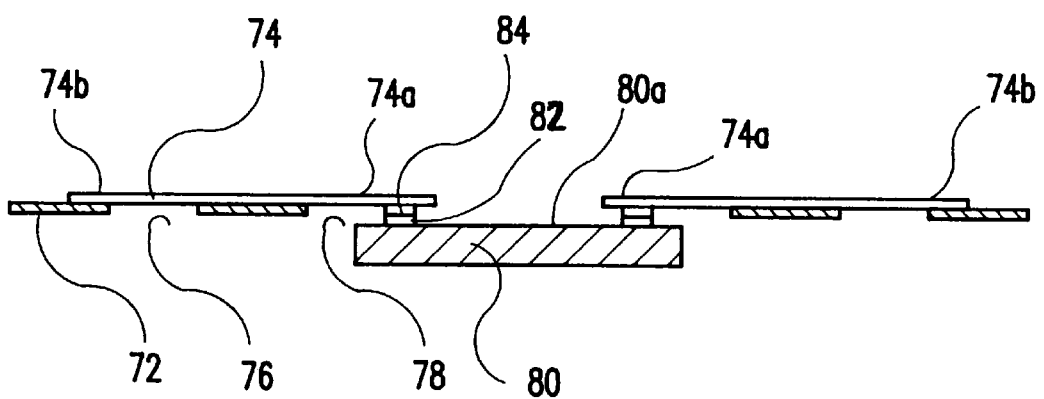
FIG. 8 is a cross-sectional view taken along the line 8—8 of FIG. 7.

FIG. 7 is a perspective view depicting inner lead bonding (ILB) between leads of a TAB tape and a semiconductor chip and FIG. 8 is a cross-sectional view taken along the line 8—8 of FIG. 7. In a TAB process, electrode pads of the semiconductor chip are group bonded to TAB leads and include many advantages such as finer lead pitch, smaller bonding pads, low cost for molding, and good electrical performance, compared with the conventional wire bonding methods.

Referring to FIGS. 7 and 8, a plurality of TAB leads 74 mad e of copper are formed on TAB film 72. An opening 78 is formed at the center of the TAB film 72 for electrically connecting leads 74 to a semiconductor chip 80. Four windows 76 are formed on the respective sides of the opening 78, with the leads 74 crossing over the windows 76 and extending into the opening 78. The windows 76 are for bonding the TAB leads 74 to an external apparatus (not shown).

The portions of the leads 74 which are connected to the semiconductor chip 80 inside the opening 78 are called inner leads 74a, and the portions of the leads 74 which cross over the windows 76 are called outer leads 74b. A plurality of sprocket holes 84 are formed in and on both sides of the TAB film 72, and thus the TAB film 72 can function as a reel type apparatus. The TAB film 72 is an adhesive film composed of polyimide, epoxy, acryl, and phenol butyl et al. A plurality of electrode pads 82 are formed on an active surface 80a of the chip 80 and metal bumps 84 are formed on the upper surfaces of the electrode pads. The ILB process which bonds the inner leads 74a to the metal bumps 84 uses a thermocompression method under a temperature of 530~550° C. in order to bond the inner leads 74a to the metal bumps 84 with a high pull strength.

Figure 9:
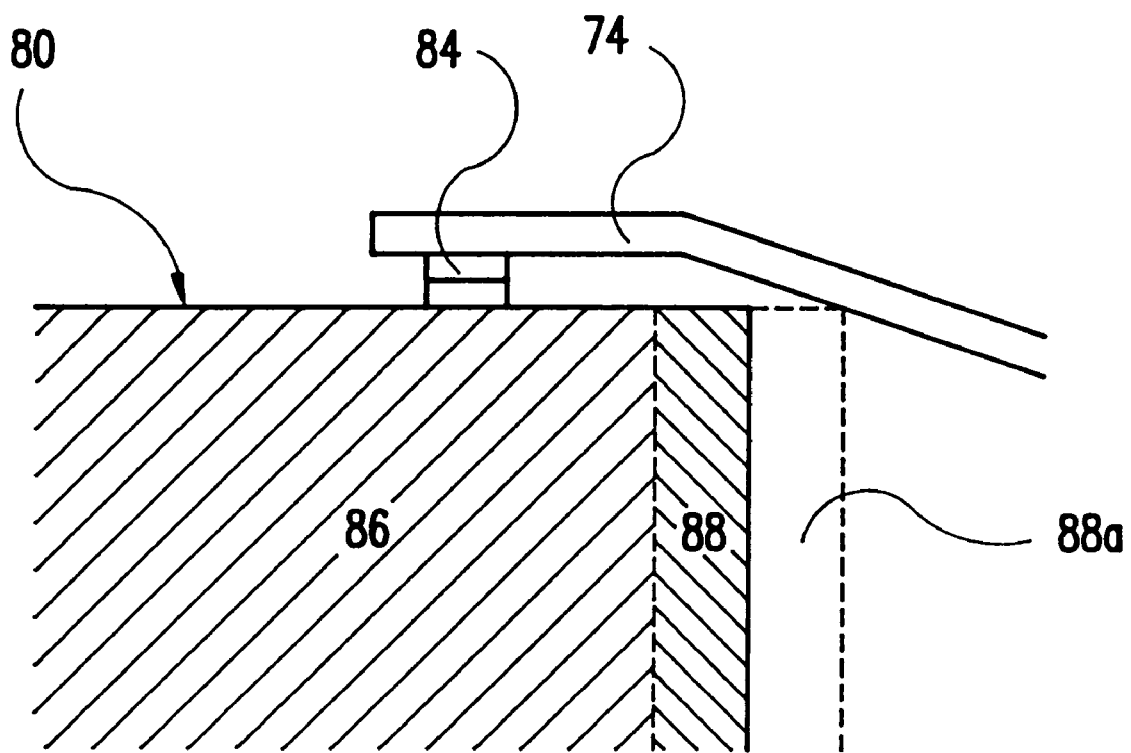
FIG. 9 is a partial sectional view depicting the relationship between a sagging lead of a TAB tape and the width of scribing regions.

As shown in FIG. 9, if the leads 74 sag, that is, portions of the leads 74 between the TAB film 72 and the bumps 84 sink and contact the edges of the chip, an electrical failure may occur. For example, when the substrate of the semiconductor chip is used as a ground terminal, if voltage of more than 0 V is applied to the leads 74 and one of the leads 74 touches the edge 88a of the chip, by sagging for example, an electric charge moves from the leads 74 to the substrate and noise is generated at the ground.

Note that, the semiconductor chip is divided into device regions 86 and the scribing regions 88 and 88a, depending on whether the regions functionally act as the IC device or not and whether the regions are physically dependent upon the other or not.

Herein, the scribing regions 88, 88a are the regions which remain after scribing the wafer with the saw blade in the conventional wafer sawing step. If the scribing regions 88, 88a are reduced, failures as a result of sagging may be decreased. There is a limit to the amount scribing regions 88, 88a may be reduced without impacting the device regions 86. However, with the present invention as above-described, since the impact of the saw blade can be reduced by forming the discontinuous insulating regions on the scribing regions, it is possible to reduce the scribing regions 88, 88a to some extent and provide a reduced scribe region 88 closer to the device regions 86. In other words, the scribe region of the present invention is reduced from the conventional scribe region 88a, represented by the dashed line, to the scribe region 88.

Another advantage described above is that if the polyimide layer and the semiconductor wafer are directly connected on portions of the discontinuous insulating regions, by coating the polyimide layer to a height sufficient not to obstruct bonding of the inner leads to the metal bumps, it is possible to farther reduce the impact of the saw blade.

According to the structure of the present invention, it is a further advantage that the total number of separated semiconductor chips formed on a single wafer increases. For example, consider a 6 inch wafer, which is usually used in a thin film transistor liquid crystal display driver, with a saw blade having a width of 30 µm. For the case where the size of the device regions is 10005 µm×1005 µm, if the width of the scribing regions reduces from 170 µm to 80 µm, the size of the separated IC chip reduces from 10145 µm×1145 µm to 10055 µm×1055 µm and the total number of the separated IC chips increases from 1272 to 1399. For the case where the size of the device regions is 9905 µm×905 µm, if the width of the scribing regions reduces from 170 µm to 80 µm, the size of the separated IC chip reduces from 10045 µm×1045 µm to 9955 µm×955 µm and the total number of the separated IC chips increases from 1415 to 1569. If the number of the separated IC chips manufactured on a single wafer increases, productivity increases and yield is improved.

According to the above-described present invention, because peeling of the insulating layer due to the impact of the saw blade is not a factor, the pattern layers on the device regions are protected and the reliability of the semiconductor IC device can be improved.

Further, since the present invention includes a polyimide layer, having a greater adhesion strength with silicon, that is directly connected with the silicon wafer surface along a portion of the discontinuous insulating regions of the scribing regions, the IC device can be further protected from the impact of the saw blade.

Moreover, with the present invention, since the scribing position of the saw blade can be closer to the device regions during the wafer sawing step, the size of the separated IC chip is reduced, the mounting density of the semiconductor IC device increases and productivity and yield are improved by increasing the number of separable IC chips manufactured on a single wafer. Further, it is possible to prevent electrical failures caused by sagging of the inner leads during the ILB process using the TAB technology.

Although preferred embodiments of the present invention have been described in detail hereinabove, it should be understood that many variations and/or modifications of the basic inventive concepts herein taught which may appear to those skilled in the art will still fall within the spirit and scope of the present invention as defined in the appended claims.

What is claimed is:

1. A method for manufacturing a semiconductor integrated circuit (IC) device, said method comprising:

preparing a semiconductor wafer having an active surface separated into device regions, with semiconductor chips formed therein, and scribe regions disposed between said device regions for dividing said semiconductor chips into separated chips, wherein each of said semiconductor chips includes an insulating layer extending along said active surface within said device region and wherein each of said scribe regions includes an exposed active surface region of said wafer;

forming a polyimide layer on each of said semiconductor chips formed in said device regions such that said polyimide layer extends over a portion of said exposed active surface region of each adjacent one of said scribe regions to directly contact said portion of said exposed active surface region; and sawing said wafer with a blade along said scribe regions such that a remaining region of said exposed active surface region is interposed between said blade and said polyimide layer.

2. The method for manufacturing a semiconductor IC device of claim 1, said preparing comprising:

forming said insulating layer on said active surface of said wafer when pattern layers of said semiconductor chips are formed on said device regions; and selectively removing said insulating layer on said scribe regions.

3. The method for manufacturing a semiconductor IC device of claim 2, wherein said selectively removing said insulating layer includes etching said insulating layer.

4. The method for manufacturing a semiconductor IC device of claim 1, wherein said polyimide layer forming includes spin coating polyimide.

5. The method for manufacturing a semiconductor IC device of claim 1, wherein said polyimide layer is formed to have a thickness of about 10 µm.

6. The method for manufacturing a semiconductor IC device of claim 1, said preparing further comprising forming a plurality of electrode pads on said semiconductor chip for electrically connecting with an external device.

7. The method for manufacturing a semiconductor IC device of claim 6, said preparing further comprising forming a plurality of metal bumps, each of said plurality of metal bumps disposed on a respective one of said plurality of electrode pads.

8. The method for manufacturing a semiconductor IC device of claim 7, further comprising, after said sawing, bonding each bump of the plurality of metal bumps to a respective one of a plurality of inner leads of a TAB film.

9. The method for manufacturing a semiconductor IC device of claim 1, said preparing comprising forming said insulating layer using a mask corresponding to said scribe regions and a plurality of electrode pads of said semiconductor chips.

10. The method for manufacturing a semiconductor IC device of claim 1, wherein said insulating layer is formed of silicon oxide.

11. The method for manufacturing a semiconductor IC device of claim 1, wherein said insulating layer is formed of an interlayer dielectric layer.

* * * * *